(12) United States Patent
Kim et al.

(10) Patent No.: US 6,723,647 B1
(45) Date of Patent: Apr. 20, 2004

(54) METHOD FOR MANUFACTURING SEMICONDUCTOR DEVICE

(75) Inventors: Dong-Yun Kim, Kyungki-do (KR); Yong-Hyeon Park, Kyungki-sil (KR)

(73) Assignee: Samsung Electronics Co., Ltd., Suwon (KR)

( * ) Notice: Subject to any disclaimer, the term of this patent is extended or adjusted under 35 U.S.C. 154(b) by 2 days.

(21) Appl. No.: 09/618,097

(22) Filed: Jul. 17, 2000

(30) Foreign Application Priority Data

Aug. 31, 1999 (KR) .......................................... 1999-36744

(51) Int. Cl.⁷ .................. H01L 21/302; H01L 21/3065; H01L 21/311
(52) U.S. Cl. ....................... 438/694; 438/706; 438/712; 438/723; 438/724
(58) Field of Search ................................ 438/694, 706, 438/723, 724, 712

(56) References Cited

U.S. PATENT DOCUMENTS

| | | | | |
|---|---|---|---|---|
| 4,418,467 A | * | 12/1983 | Iwai ............................. 29/574 |
| 4,835,592 A | * | 5/1989 | Zommer ....................... 357/68 |
| 5,132,252 A | * | 7/1992 | Shiraiwa et al. ............ 438/703 |
| 5,266,511 A | * | 11/1993 | Takao .......................... 438/401 |
| 5,369,050 A | * | 11/1994 | Kawai ......................... 438/401 |
| 5,391,902 A | * | 2/1995 | Kajita ......................... 257/317 |
| 5,468,664 A | * | 11/1995 | Kajita ......................... 438/703 |
| 5,482,893 A | * | 1/1996 | Okabe et al. ................ 438/401 |
| 5,578,165 A | * | 11/1996 | Patrick et al. ................ 216/68 |
| 5,663,099 A | | 9/1997 | Okabe et al. |
| 5,773,196 A | * | 6/1998 | Shih ............................ 430/313 |
| 5,783,490 A | * | 7/1998 | Tseng .......................... 438/692 |
| 5,786,267 A | | 7/1998 | Haraguchi et al. |
| 5,869,383 A | * | 2/1999 | Chien et al. ................. 438/401 |
| 6,242,337 B1 | * | 6/2001 | Okada ......................... 438/622 |

OTHER PUBLICATIONS

Wolf et al., Silicon Processing for the VLSI Era: Presess Technology, vol. 1, (1986), Lattice Press, pp. 418–420 and title page. .*

* cited by examiner

Primary Examiner—Nadine G. Norton
Assistant Examiner—Lynette T. Umez-Eronini
(74) Attorney, Agent, or Firm—Volentine Francos, PLLC

(57) ABSTRACT

A method is disclosed for manufacturing a semiconductor device. Initially, a conductive layer is formed over a cell array region, in which high-integrated devices are formed, and over a non-cell region, which functions to assist a proper formation of the cell array region. An etching mask pattern is then formed over the conductive layer to form a conductive pattern over the cell array region and to remove the conductive layer formed on the non-cell region. The conductive pattern is actually formed by etching the conductive layer. An ion-assisted plasma etching is then implemented to form a pattern on the cell array region. This prevents the generation of arcing caused by independent conductive patterns formed on the non-cell region during the ion-assisted plasma etching.

19 Claims, 8 Drawing Sheets

METHOD FOR MANUFACTURING SEMICONDUCTOR DEVICE

BACKGROUND OF THE INVENTION

The present invention relates to a method for manufacturing a semiconductor device. More particularly, the present invention relates to a method for manufacturing a semiconductor device in which the processing conditions of a non-cell region is improved to decrease a defect generating ratio at a cell array region, which ultimately increases the manufacturing yield.

Generally, in the manufacturing process of a semiconductor device, a number of steps are required to process a non-cell region to obtain a necessary cell array region that is needed for the highly integrated circuit chips. An alignment mark is an example of the non-cell region. The alignment mark is needed for a correct exposure of light onto a corresponding position of a circuit during numerous implementations of a photolithographic method that are required in the manufacture of the semiconductor device. The alignment mark is separately formed on a region such as a scribe line or an edge device that will be discarded after final production.

The role of the alignment mark will now be described in more detail. Conventionally, a semiconductor device is manufactured by repeating a process of depositing various materials and then patterning the same a number of times. A desired shape of a material layers is obtained by using the structure of a preceding layer. In other words, the preceding material layer and a photomask must be correctly aligned for the light exposure to obtain an accurate photoresist pattern during a number of accompanying photolithography processes.

However, as the deposition of various materials proceeds, the crookedness of the material layer gradually disappears and the circuit pattern on the cell array region becomes more complicated. Therefore, the correct alignment of the photomask for the subsequent layers over the underlying material layer becomes difficult. To solve this problem, a number of alignment marks are formed in a certain region, for example, on a scribe line, with respect to the material layers obtained at each step of the manufacturing process. The alignment marks are not integral parts of the device, but they are formed as a circuit of the non-cell region to assist the manufacturing process. Methods for manufacturing such alignment marks are disclosed by U.S. Pat. Nos. 5,369,050 (issued to Kawai), 5,663,099 (issued to Okave et al.) and 5,786,267 (issued to Karguchi et al.).

A lot ID illustrates another example of a non-cell region. The lot ID is formed in an appropriate region on a wafer by labeling a number or a symbol by means of a laser after inspecting the wafer and prior to processing the wafer for device manufacturing. The lot ID generally includes lot designating symbols and wafer designating symbols for differentiating each wafer. One lot includes one bundle of wafers to be processed by the manufacturing process. The lot ID, which is formed for the purpose of designation, is also used as an alignment mark as needed. However, the lot ID commonly becomes covered by various materials during the progression of the device manufacturing process.

Edge devices not having proper sizes of unit devices and which remain at the edge portions of the wafer, offer a third example of the non-cell region. The formation of the edge devices are due to the shape of the wafers. In other words, because the shape of the wafers is not square but is circular, a number of edge devices are formed along the edge portion of the wafers. Semiconductor devices are not formed on the edge devices but various layers of materials are formed on the edge region during the manufacturing process. Generally, alignment marks are formed on these edge devices.

In the non-cell region described above, the applied material formed on the cell array region during each step of the manufacturing process is also simultaneously formed. However, unlike in the cell array region, independent conductive patterns which are not earthen to the underlying silicone substrate, i.e., which are not connected to ground, are formed at the non-cell regions. As a result, the independent conductive patterns may be exposed during a subsequent dry etching using ion-assisted plasma. At this time, the generated ions and plasma may be electrically charged, and when a critical point has been reached by the movement of the etching plasma, the exposed independent patterns may instantaneously discharge, causing an arcing phenomenon. Once the arcing is generated, the region where the arcing has originated may melt or materials around the arcing generated portion may randomly tear off, potentially causing a 0% yield for the wafer. The arcing may also damage the existing alignment marks, resulting in a misalignment of the photomask with the cell array region during the subsequent photolithography process, also resulting in a decreased yield.

The arcing phenomenon will be explained in more detail with reference to the alignment mark. FIG. 1 is a cross-sectional view showing the structure of an alignment mark AM manufactured by a conventional method. A gate electrode material layer 12 including a polysilicone layer 12a and tungsten silicide (WSi) layer 12b, is formed on a silicone substrate 10. A first oxide layer 13 and a first insulation layer 14 are formed on the gate electrode material layer 12. The first oxide layer 13 is a high temperature thermal oxide layer, and the first insulation layer 14 is preferably an undoped silicate glass (USG) layer. A bit line material layer 15 is formed on the first insulation layer 14. The bit line material layer 15 includes a polysilicone layer 15a and a tungsten silicide layer 15b. A second insulation layer 16, i.e. a borophosphosilicate glass (BPSG) insulation layer, and a second oxide layer 17, which is another high temperature thermal oxide layer, are subsequently formed on the bit line material layer.

During the formation of the alignment mark (AM) by an integration of the various materials mentioned above, a cell array region of the device is formed as follows. A gate electrode is formed on the substrate and is then electrically insulated. Then, a bit line, which is connected to an impurity doped region, i.e. a source/drain region, is formed and is electrically insulated by depositing an insulating material on the substrate. Thereafter, a portion of the insulating material is removed to form a contact hole that exposes the impurity doped region, i.e. the source/drain region on the substrate. A storage node is then formed on the insulating material so that the source/drain region and the storage node are connected through the contact hole.

The structure illustrated in FIG. 1 is obtained at the step of forming a photoresist pattern 18 on the second oxide layer 17. The photoresist is formed by depositing a photoresist and then opening a portion to be etched for the formation of the contact hole. After this step, the portion opened by the photoresist pattern 18 is etched and removed down to the upper portion of the substrate to form the contact hole. At the same time, an etching is simultaneously implemented at the alignment mark region for the formation of an alignment mark that will be used for the subsequent photolithographic process. However, unlike in the cell array region, the gate electrode material layer 12 and the bit line material layer 15 are not earthen to the substrate, i.e., they are not connected to ground, and are independently formed as conductive patterns at the non-cell region. Accordingly, when an ion-assisted plasma dry etching is implemented and these independent conductive patterns are exposed to the plasma, arcing might be generated.

FIG. 2 is a cross-sectional view for showing the structure surrounding the alignment mark of FIG. 1 when an arcing is generated by a reactive ion etching process. The reference numeral 11 designates an etched portion around the alignment mark. The portion where the arcing is generated is melted away as shown by an arcing generating portion 19. Otherwise, the arcing generated portion tears off and the yield of the device becomes inevitably lowered.

FIG. 3 is a cross-sectional view for showing the structure around the alignment mark of FIG. 1 when a contact hole is not completely opened by the reactive ion etching process due to the generation of the arcing. This is also one factor which may contribute to the lowering of the yield. When the arcing is generated after the completion of etching and at the initial point of overetching, it is assumed that the yield of the wafer is lowered through the generation of the phenomenon illustrated in FIG. 2. When the arcing is generated during the implementation of an etching process, it is assumed that an etched portion 11 is not opened as illustrated in FIG. 3. At this time, the contact hole is only partially established on the cell array region, which can drop the yield of the wafer to 0%. This defect is caused by an insufficient etching of the region where the contact hole is to be formed, resulting from the lowering of an etching rate caused by the generation of heat at the arcing region.

The frequency and degree of the arcing depend on the material of the exposed conductive layer. According to repeated experiments by the present inventors, the most serious arcing is generated when a bit line formed by polysilicone/tungsten silicide is exposed to an ion-assisted plasma. Somewhat lighter arcing has been observed when a pad electrode is formed by polysilicone and the pad electrode is followed by a gate electrode formed by polysilicone/tungsten silicide. Furthermore, as the etching power for the ion-assisted plasma etching increases, the possibility of the arcing generation also increases.

Among the non-cell regions, a lot ID is formed by labeling a certain symbol by means of the laser on an appropriated region after inspecting a wafer and prior to implementing the device manufacturing process. During the manufacturing process, the lot ID becomes covered with various materials. These materials are usually used as an alignment mark or may be removed during the following process of forming subsequent layers.

After forming a bit line material layer, a BPSG insulation layer, a high temperature thermal oxide layer, and a photoresist pattern are formed on the lot ID. The high temperature thermal oxide layer, the BPSG insulation layer, and the bit line material layer formed on the lot ID are sometimes etched in this order during the step of forming a contact hole by using an ion-assisted plasma etching in order to expose the lot ID. At this time, the bit line material layer formed on the lot ID is an independent conductive pattern that is not earthen to the substrate, similar to an alignment mark, and thus can be a factor leading to the generation of an arc.

FIG. 4 is illustrated for showing the positions of a lot ID and an edge device on a wafer. As shown in FIG. 4, an edge device 4 and a lot ID 5 are formed at appropriate positions on a wafer 1.

Another factor that can generate arcing is the edge device region of the wafer. FIG. 5 is a cross-sectional view of an edge device region of a wafer manufactured by another conventional method. As compared to the device of FIG. 1, the structure shown in FIG. 5 is simplified, and the oxide layer is omitted.

First, the structure will be explained in brief. A gate electrode material layer 22, a first insulation layer 23, a bit line material layer 25, a second insulation layer 27, and a photoresist pattern 28 are sequentially formed on a silicone substrate 20. Thereafter, an ion-assisted plasma etching is implemented to open a contact hole on the cell array region. Because the wafer has a circular shape, it is difficult to form a device on its edge portion and after the completion of device fabrication in the cell array region, the edges are discarded. Accordingly, the edge region may be used as the alignment mark or may merely remain as an integrated structure of various materials. The position of an edge device 4 is designated in FIG. 4. When the edge device is used as an alignment mark, further problems may exist in addition to the generation of arcing.

During the device manufacturing, multiple photolithographic processes are used. In each photolithographic process, a photoresist is coated on a wafer to form a photoresist layer. The photoresist layer, which mainly includes organic material, is a flowing material. Therefore, the photoresist on the wafer flows to a side portion 20a to form an undesirable side photoresist layer. The distance between the side portion 20a of the wafer and a holding apparatus of the wafer is generally about 0.25–0.3 mm. However, the photoresist layer formed on the side portion 20a is thicker than the distance between these two and as a result, dried photoresist, which separates into particles, floats within an apparatus and may cause defects. In order to solve this problem, the edge portion of the wafer is separately exposed and the side portion of the wafer is rinsed using a solvent such as thinner. However, during the exposure and rinsing used to remove the side photoresist layer, an edge portion of the photoresist formed on the wafer also is inevitably exposed and removed.

For example, the edge portion of the photoresist pattern 28 that will be used for the formation of a contact hole is also partially removed by the side rinse process of removing the side photoresist layer as shown in FIG. 5. After the ion-assisted plasma etching for the formation of the contact hole, the portion of the layer under the photoresist pattern 28 remains while the portion of the layer not covered by the photoresist pattern 28 is removed. In other words, the portion of the layer outside of a dashed line 21 is removed for the conventional edge portion of the wafer as shown in FIG. 5. At this time, if an independent conductive pattern such as the bit line material layer 25 or the gate electrode material layer 22 is extended to the outer portion from the dashed line 21, the independent pattern becomes exposed to the ion-assisted plasma during the etching. In this case, the arcing may be generated during the etching or at the overetching point.

Thus, the prevention of the generation of arcing at the non-cell region caused by independent pattern which is not earthen, i.e., which is not connected to ground, during the manufacturing process of the device on the cell array region remains a very important problem to be resolved.

SUMMARY OF THE INVENTION

Accordingly, it is an object in the present invention to provide a method for manufacturing a semiconductor device of which manufacturing process for the non-cell regions is improved to decrease the generation of arcing at the same region, which will increase the yield of semiconductor devices.

To accomplish the object, a method is provided for manufacturing a semiconductor device. In this method, a conductive layer is formed over a cell array region in which high-integrated devices are formed and over a non-cell region that functions to assist a proper formation of the cell array region. An etching mask pattern is formed over the conductive layer. Then a conductive pattern is formed over the cell array region and a portion of the conductive layer formed over the non-cell region is removed, by etching the conductive layer using the etching mask pattern as a mask. Next, an ion-assisted plasma etching is implemented to form a pattern over the cell array region.

The non-cell region may include one of: an alignment mark used for properly aligning a mask and the cell array region during a photolithographic process, a lot ID for recognition of a wafer, which also functions as the alignment mark, and a region including the alignment mark and the lot ID. The conductive pattern may comprise polysilicone, tungsten silicide (WSi), or a composite layer containing both polysilicone and tungsten silicide. The conductive pattern is preferably selected from the group consisting of a bit line, a pad electrode, and a gate electrode. The etching mask pattern is preferably a photoresist pattern, most preferably a positive-type photoresist pattern.

The method may further comprise exposing a substrate on which a field isolation region is formed, the exposing being implemented by etching an oxide layer and an insulation layer formed over the non-cell region.

The object of the present invention also can be accomplished by the following method for manufacturing a semiconductor device. A plurality of highly-integrated devices are formed in a cell array region and a non-earthen conductive pattern is formed over a non-cell region of a substrate. An etching mask pattern is then formed that exposes a predetermined region over the cell array region and covers the non-cell region, and an ion-assisted plasma etching is implemented to etch the exposed region by the etching mask pattern.

The non-cell region preferably includes either an edge device formed on an edge region of a wafer, a lot ID for recognition of each wafer, or a region including the edge device and the lot ID. The conductive pattern preferably comprises polysilicone, tungsten silicide (WSi) or a composite layer containing both polysilicone and tungsten silicide. The conductive pattern is preferably selected from the group consisting of a bit line, a pad electrode, and a gate electrode. The ion-assisted plasma etching is preferably to implemented by reactive ion etching (RIE), magnetic enhanced reactive ion etching (MERIE), or thermo coupled plasma etching (TCPE). The output power during implementation of the ion-assisted plasma etching is preferably higher than 500W, most preferably in a range of about 1500–1700W.

The ion-assisted plasma etching is preferably implemented for the formation of a contact hole including a buried contact (BC) hole, a metal contact (MC) hole, and a direct contact (DC) hole. In this method, the etching mask pattern is preferably a photoresist pattern. The photoresist pattern of the edge device is preferably formed by forming a photoresist layer over the substrate and removing the photoresist layer formed over an edge portion, including a side portion of the substrate, by edge exposure and side rinse. A first distance from an end of the substrate to the photoresist pattern is shorter than a second distance from the end of the substrate to the conductive pattern.

A method for manufacturing a semiconductor device is also provided that includes the steps of forming a conductive layer over a cell array region, in which high-integrated devices are formed, and over a non-cell region, which functions to assist a proper formation of the cell array region; forming a photoresist pattern over the conductive layer; etching the conductive layer using the photoresist pattern as a mask to form a conductive pattern over the cell array region and to remove the conductive layer formed over the non-cell region; and implementing an ion-assisted plasma etching. In this method, the non-cell region includes an alignment mark for properly aligning a mask and the cell array region during a photolithographic process, or a lot ID for recognition of a wafer that functions as the alignment mark, the conductive pattern is selected from the group consisting of a bit line, a pad electrode, and a gate electrode, and the ion-assisted plasma etching is reactive ion etching (RIE) or magnetic enhanced reactive ion etching (MERIE).

A method for manufacturing a semiconductor device is also provided that includes forming a photoresist pattern to expose a predetermined region over a cell array region, in which high integrated devices are formed, and to cover a non-earthen conductive pattern formed over a non-cell region to assist a proper formation of the cell array region; and implementing an ion-assisted plasma etching using the photoresist pattern as a mask, to etching an exposed region. In this method, the non-cell region includes an edge device formed over an edge region of a wafer or a lot ID for recognition of each wafer, the conductive pattern is selected from the group consisting of a bit line, a pad electrode, and a gate electrode, and the ion-assisted plasma etching is reactive ion etching (RIE) or magnetic enhanced reactive ion etching (MERIE).

In the present invention, the generation of arcing phenomenon can be prevented by eliminating the independent conductive pattern, which is a factor of generating arcing during the ion-assisted plasma etching from the exposure of the plasma. The prevention is performed by removing or covering the independent conductive pattern before implementing the ion-assisted plasma etching.

BRIEF DESCRIPTION OF THE DRAWINGS

The above object and advantages of the present invention will become more apparent by describing in detail preferred embodiments thereof with reference to the attached drawings, in which.

DESCRIPTION OF THE PREFERRED EMBODIMENTS

Figure 1:
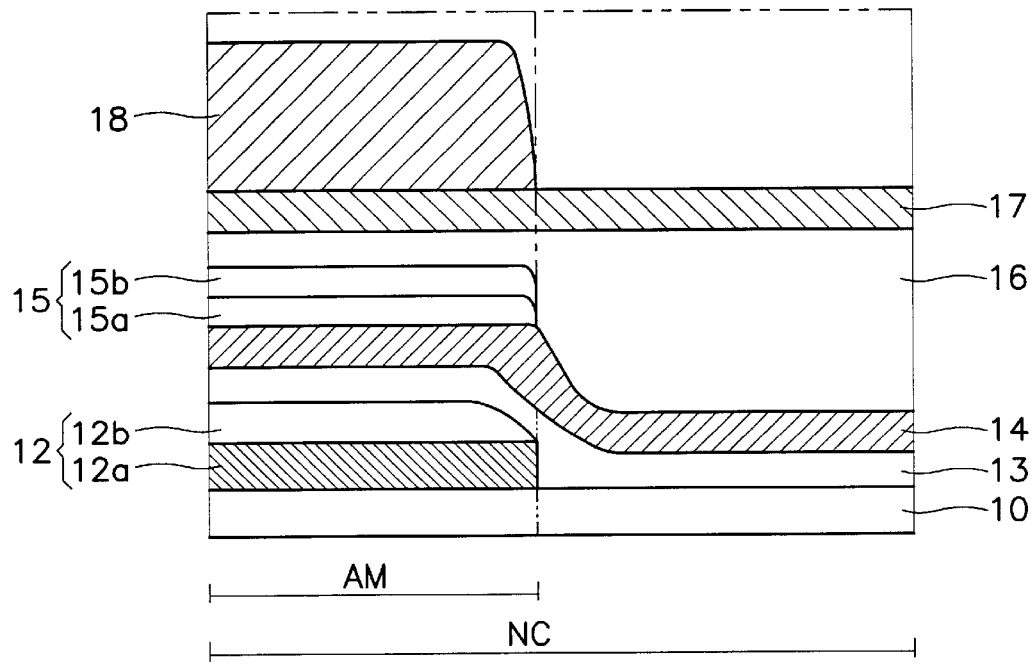
FIG. 1 is a cross-sectional view showing the structure of an alignment mark manufactured by a conventional method.
Figure 2:
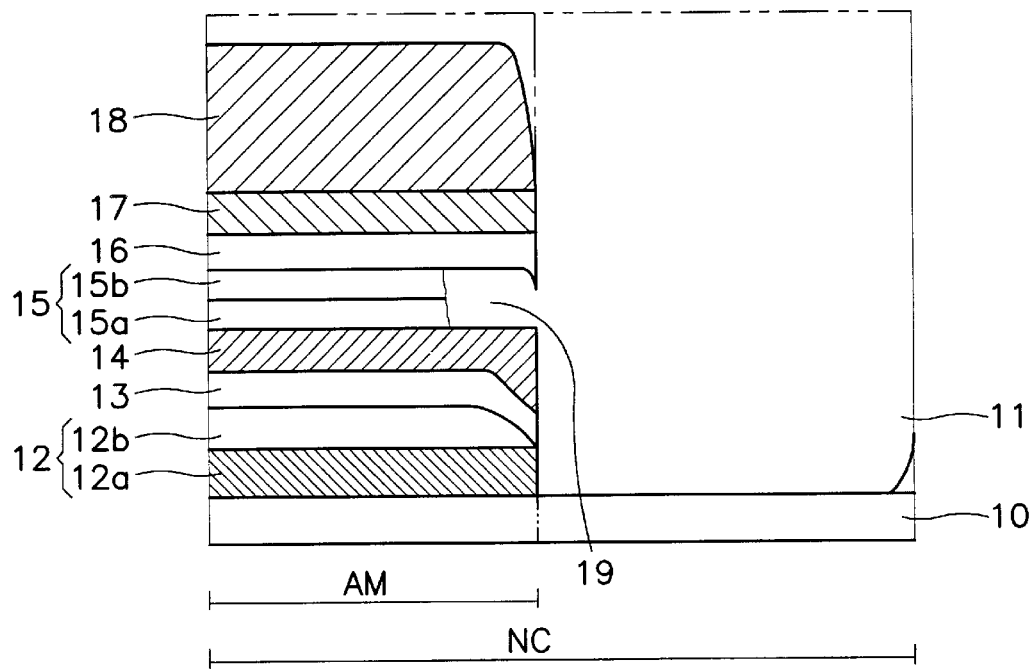
FIG. 2 is a cross-sectional view showing the structure around the alignment mark of FIG. 1, when arcing is generated during a reactive ion etching process.
Figure 3:
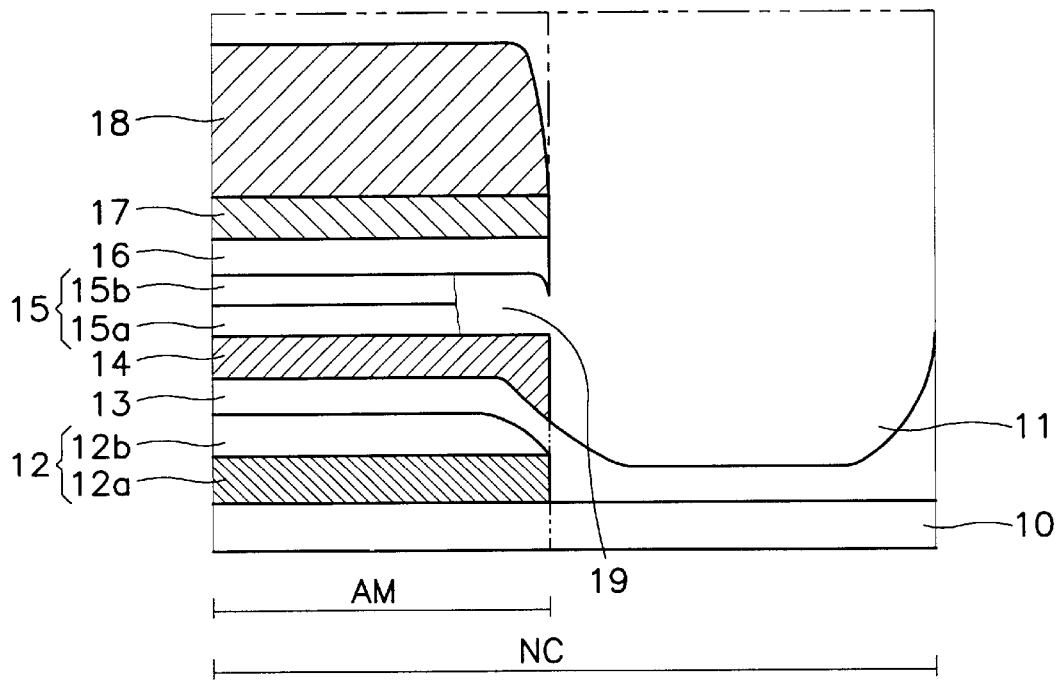
FIG. 3 is a cross-sectional view showing the structure around the alignment mark of FIG. 1, when a contact hole is incompletely formed due to the generation of arcing during a reactive ion etching process.
Figure 4:
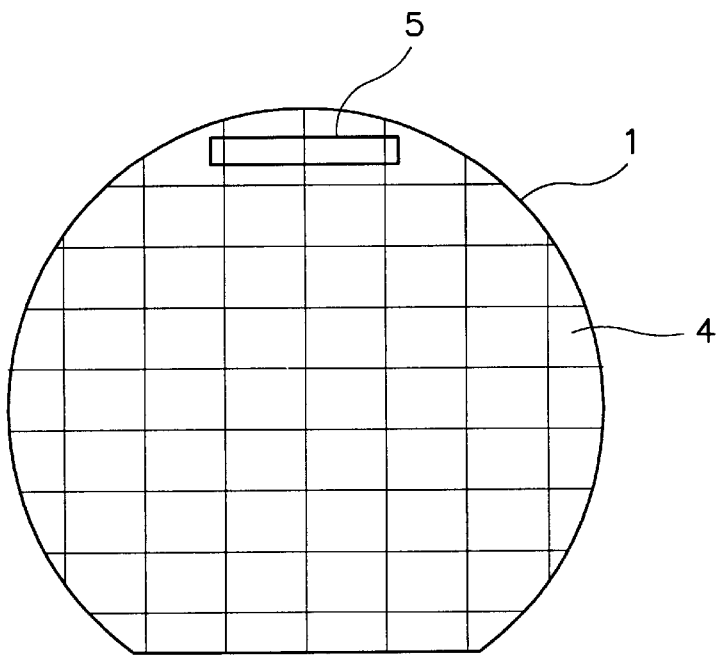
FIG. 4 shows the positions of a lot identification (ID) and an edge device on a wafer.

The present invention will be explained in more detail below.

Alignment marks formed for the correct alignment of a photomask and a cell array region during the implementation of the photolithographic method and lot IDs formed for the recognition of each wafer while functioning as an alignment mark are both examples of a non-cell region. These non-cell regions are each a simple structure comprised of layers including different materials that are also formed over a nearby cell array region. A predetermined pattern is formed over these non-cell regions to align a proper formation of subsequent layers in the cell array region.

An independent conductive pattern that is not earthen, i.e., that is not connected to ground, and that is formed on the non-cell region, might generate arcing during the implementation of an ion-assisted plasma etching. Therefore, an etching mask pattern is formed to be open over the non-cell region, i.e., the etching mask pattern does not cover the non-cell region, during the formation of a conductive pattern on the cell array region, so that the underlying conductive layer on the non-cell region can be removed and the formation of the independent conductive pattern can be prevented.

As an example of the conductive pattern, a pattern formed by polysilicone, tungsten silicide, or a composite layer formed by both polysilicone and tungsten silicide can be used. In particular, the conductive pattern can be a bit line, a pad electrode, a gate electrode, or the like.

An oxide layer and/or an insulation layer formed over the non-cell region could be etched during any etching step to expose the substrate on which a field isolation region is formed. In this case, the alignment during the implementation of the photolithographic method could be carried out with reference to the field isolation region.

The etching mask used in this invention pattern is preferably a photoresist pattern and a positive-type photoresist pattern is most preferable.

According to another method of the present invention, however, an etching mask pattern is formed to expose a predetermined region of a cell array region over which highly integrated devices are formed, and to cover a conductive pattern which is not earthen and formed on a non-cell region. The non-cell region functions to assist with the proper formation of the cell array region. Accordingly, a conductive pattern formed over the non-cell region is not exposed during the etching, and so arcing can be prevented.

An ion-assisted plasma etching can be implemented by a reactive ion etching (RIE) method, a magnetic enhanced reactive ion etching (MERIE) method, or a thermo coupled plasma etching (TCPE) method. The method of the present invention could be advantageously applied when the output power during the implementation of the plasma etching is higher than 500W, particularly, in the range of 1500–1700W because of the high probability of arcing.

As for the etching process requiring a plasma etching method with a high output power, an etching process for forming a contact hole including a buried contact (BC) hole, a metal contact (MC) hole, and a direct contact (DC) hole can be illustrated.

The present invention will be described below in more detail with reference to the accompanying drawings. A resolution of the problems accompanied by the alignment mark needed for the implementation of the photolithographic method will now be described. First, the photolithographic method will be explained in brief.

Initially, a photoresist is coated over a layer to be patterned, such as an insulation layer, a conductive layer, and the like, while rotating a substrate at 100–1000 rpm. Then, the substrate is rotated to a higher velocity of about 2000–6000 rpm so that the photoresist will radially and uniformly spread over the substrate by centrifugal force. The spread photoresist is then dried to obtain a photoresist layer of which solubility could change by an exposure to a light such as ultraviolet or X-ray. The photoresist layer is selectively exposed to the light using a photomask patterned to selectively expose the photoresist layer. A portion having high solubility (i.e., the exposed portion for a positive-type photoresist) is removed and a portion having lower solubility (i.e., the unexposed portion for a positive-type photoresist) remains after a development. The underlying layer exposed by the photoresist pattern is then etched to form an underlying layer pattern, and the remaining photoresist is removed to obtain a pattern necessary for various wiring processes, electrodes, and the like.

Fine patterns having a high resolution may be manufactured using the above-mentioned photolithographic method described above, making this process essential for the manufacture of the semiconductor devices. To implement the photolithographic method, a mask and the photoresist layer should be correctly aligned for accurately transferring the mask pattern onto the photoresist layer. For this alignment, an alignment mark is necessary.

Figure 6:
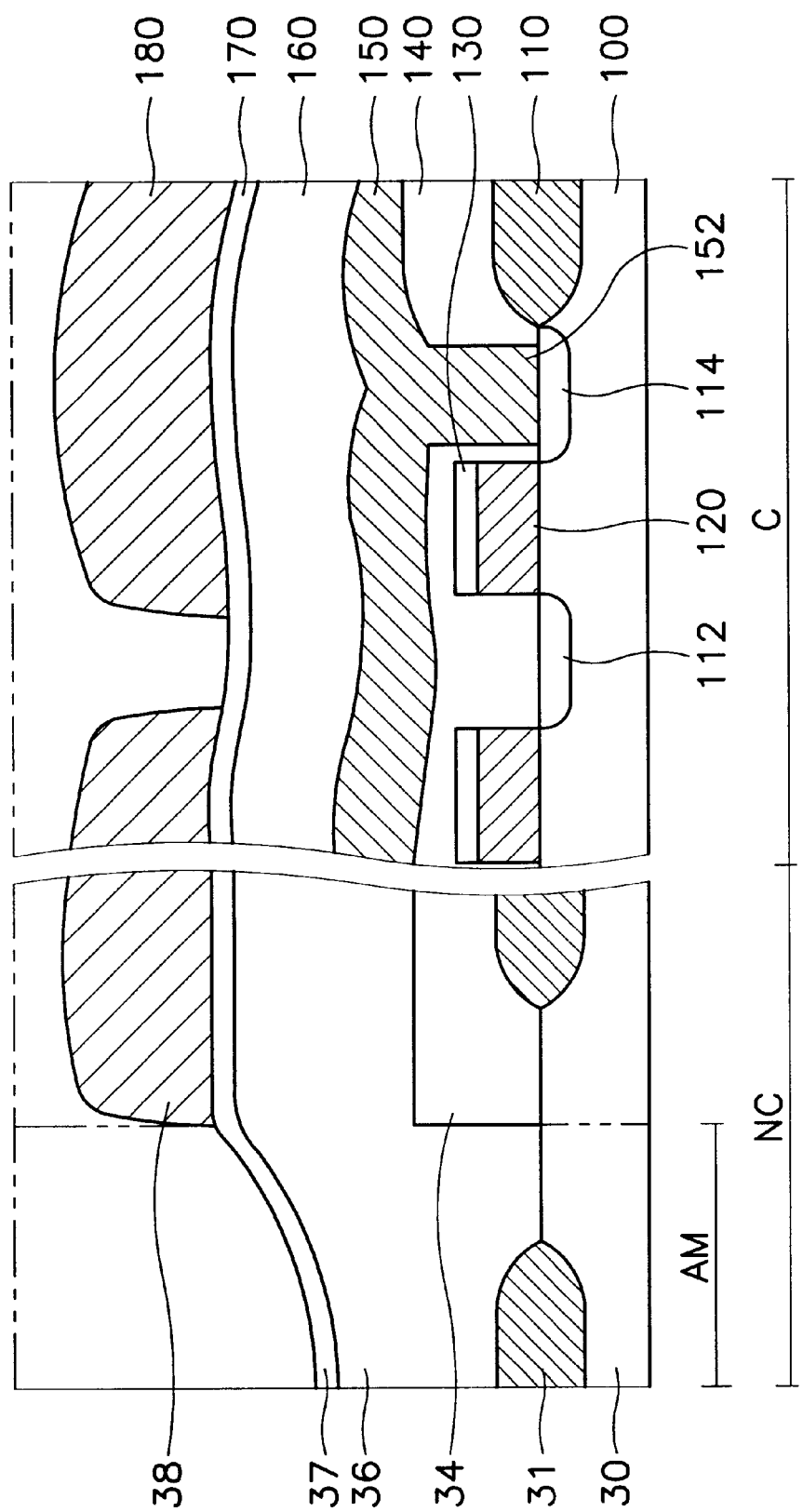
FIG. 6 is a cross-sectional view showing the structure of an alignment mark region and a cell array region manufactured by a first preferred embodiment of the present invention at the same stage illustrated in FIG. 1.

FIG. 6 is a cross-sectional view showing the structure of an alignment mark region as an example of a non-cell region NC and a cell array region C manufactured by a first preferred embodiment of the present invention at the same stage illustrated in FIG. 1. When comparing to FIG. 1, it can be seen that several layers, including an independent pattern that could generate arcing, such as a gate electrode material layer and a bit line material layer, are not formed over an alignment mark AM in FIG. 6.

In other words, a second insulation layer 36, preferably made of BPSG, and a second oxide layer 37 are preferably formed over a substrate 30 having a field oxide layer 31. However, an independent conductive layer that is not earthen, is not formed on the alignment mark region.

The structure on the cell array region C is as follows.

A gate, including a gate electrode 120 and a first oxide layer 130, is formed over a substrate 100 over which a field oxide layer 110 is formed. An impurity doped source region 112 and a drain region 114 also are formed at the upper portions of the substrate 100. A first insulation layer 140 is formed and a bit line 150 contacting the drain region 114 is formed through a DC contact hole 152. Next, a second insulation layer 160, preferably comprising BPSG for insulation and planarization, and a second oxide layer 170 are formed. The uppermost photoresist pattern 180 serves as an etching mask pattern for the subsequent formation of a contact hole for exposing the source region 112.

According to the first preferred embodiment of the present invention, the alignment mark region having the left-side structure of a non-cell region NC is obtained after implementing the procedure for the formation of the right-side structure of the cell array region C in FIG. 6.

The method for obtaining the alignment mark region having the structure illustrated in FIG. 6 will be explained in detail with reference to the structure obtained for the cell array region. FIGS. 7A–7F are show the manufacturing process of the alignment mark region of FIG. 6.

First, a polysilicone layer 32a is formed by depositing polysilicone on the substrate 30 having a field oxide layer 31 for defining the isolation region, and a tungsten silicide layer 32b is formed by depositing tungsten silicide thereon for the cell array region. A first oxide layer 33 is formed over the gate electrode material layer 32 comprised of the polysilicone layer 32a and the tungsten suicide layer 32b. This three layer structure that is formed for the cell array region is also simultaneously formed on the alignment mark region (see FIG. 7A).

The region where the gate electrode is to be formed, i.e., a portion of polysilicone/tungsten suicide layers 32a and 32b and first oxide layer 33, is covered by a photoresist and the underlying layer to be etched is exposed by removing the photoresist. The exposed polysilicone/tungsten silicide layers 32a and 32b and first oxide layer 33 are etched away and then the remaining photoresist is removed to manufacture the gate electrode on the cell array region. At the same time, the gate material layer is etched to manufacture a pattern for the alignment mark on the alignment mark region.

Conventionally, the gate material layer to be used as an alignment mark was covered by a photoresist layer while its surrounding region was exposed. As a result, the gate material layer of the surrounding region was removed during the etching process of forming a gate while simultaneously forming an alignment mark made of the gate material layer. The resulting alignment mark was used for correctly aligning the mask and the device on the cell array region during the photolithographic method. However, the gate electrode material layer 32 of the alignment mark caused frequent generation of arcing during the subsequent ion-assisted plasma etching process. Accordingly, to prevent such occurrences, the gate electrode material layer 32 of the alignment mark is also etched and removed during the formation of the gate in the present invention (see FIG. 7B).

In the present invention, since the gate electrode is a conductive layer that is firstly formed on the substrate, it does not induce arcing during the ion-assisted plasma etching.

In the meantime, the alignment for the next photolithographic process could be resolved by using the field oxide layer 31 formed thereunder. In other words, a light having a wavelength of 638 nm passes through the photoresist layer and is then reflected by the substrate 30 or the field oxide layer 31. Since the wavelengths of the light reflected by the substrate 30 and that of the field oxide layer 31 are different, the alignment can be accomplished by using this characteristic.

Figure 7A:
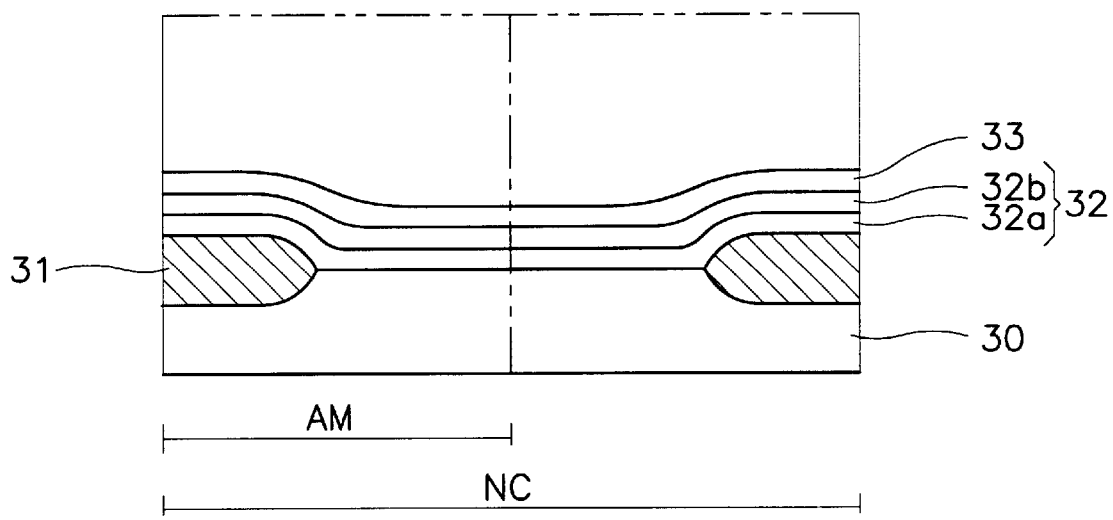
FIGS. 7A–7F are sectional views showing manufacturing processes of the alignment mark region of FIG. 6.
Figure 7B:
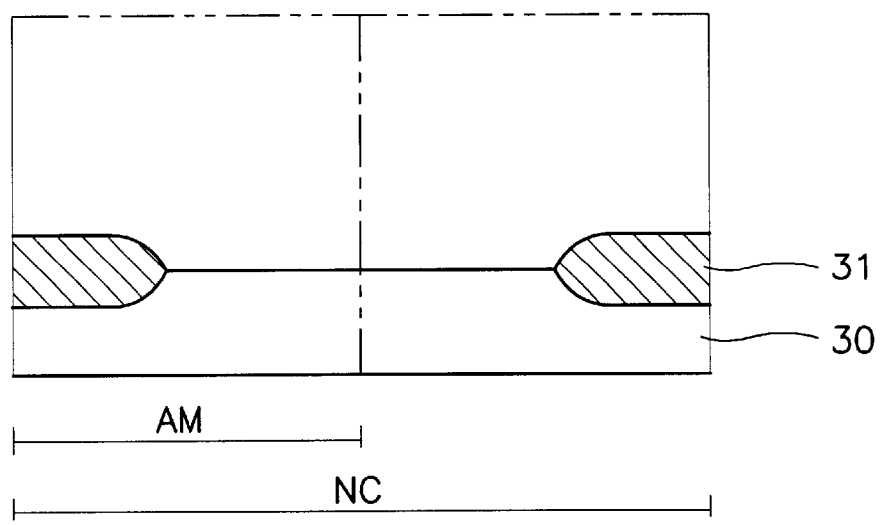
Figure 7C:
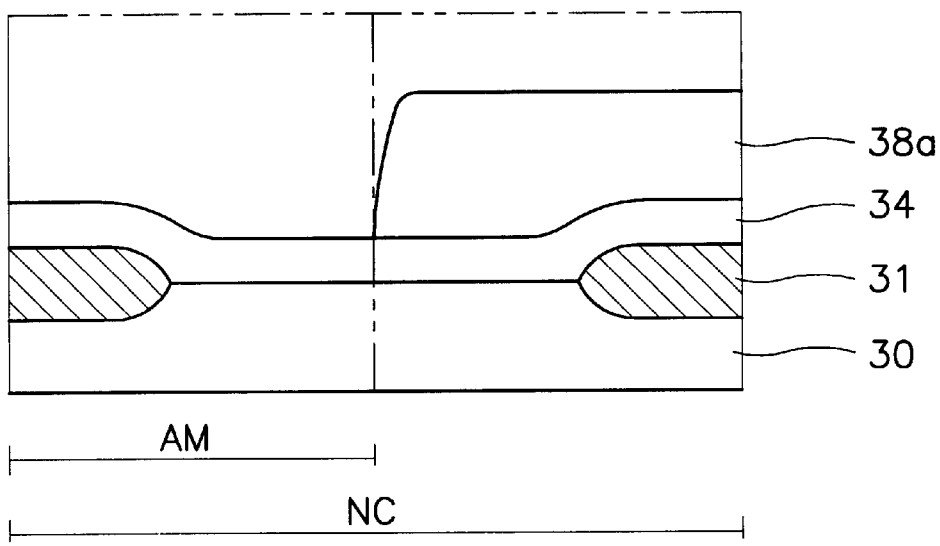
Figure 7D:
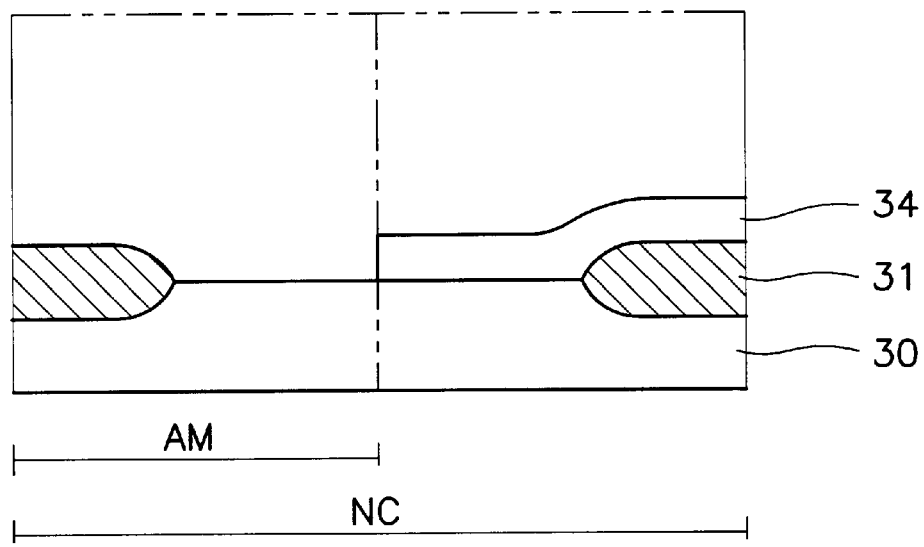
Figure 7E:
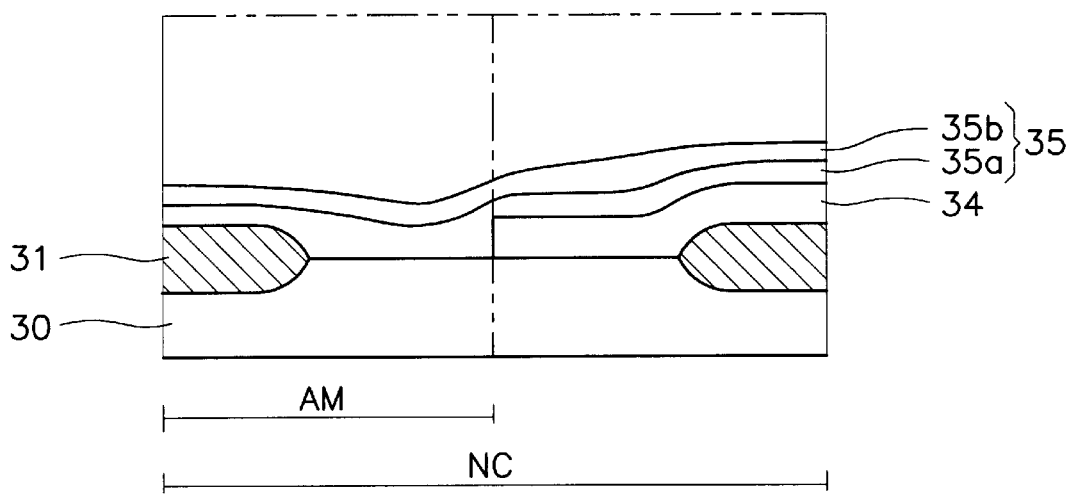
Figure 7F:
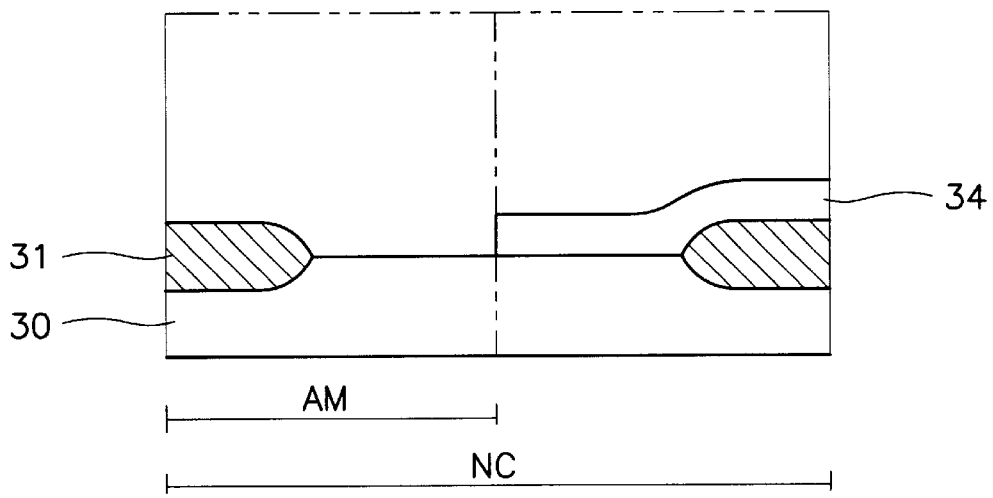

Thereafter, a first insulation layer 34, preferably made of USG, is formed according to the order of the manufacturing process (see FIG. 7C). A bit line is then formed in the cell array region over the first insulation layer 34. The first insulation layer 34 on the cell array region is then etched to form a direct contact hole to expose the impurity doped region on the silicone substrate using a photoresist pattern 38a. At the same time, the first insulation layer 34 on the alignment mark region is removed (see FIG. 7D).

A polysilicone layer 35a and a tungsten silicide layer 35b are then formed over the resulting structure for the subsequent process of forming a bit line in the cell array region. A bit line material layer 35 is also simultaneously formed over the alignment mark region at this stage (see FIG. 7E) by polysilicone/tungsten silicide like the gate electrode material layer 32 of FIG. 7A. The bit line material layer 35 is preferably an independent pattern which is not earthen, and so can cause the generation of arcing during the subsequent ion-assisted plasma etching process. Therefore, this bit line material layer 35 is removed from the alignment mark region.

In other words, the polysilicone layer 35a and the tungsten suicide layer 35b are formed over the first insulation layer 34. Then, the photoresist pattern is formed so that the portion of photoresist where the bit line is formed on the cell array region remains while the remaining portion of the photoresist pattern is exposed by light exposure (when using the positive-type photoresist). At this time, the bit line material layer 35 on the alignment mark region is exposed. The exposed bit line material is removed by reactive ion etching process to leave behind the unexposed bit line material to manufacture the bit line on the cell array region, while all of the bit line material layer 35 in the alignment mark region is removed (see FIG. 7F). At this time, because the bit line material around the alignment mark region is an independent conductive pattern firstly formed on the substrate, the arcing is not generated by the conductive pattern.

Then, a second insulation layer 36, preferably made of BPSG, and a second oxide layer 37, which is preferably a thermal oxide layer, are formed according to the order of the manufacturing procedure (see FIG. 6). The second insulation layer 36 is formed for the insulation and planarization and second oxide layer 37 is formed to more effectively pattern and form a contact hole during the subsequent photolithographic process.

The photoresist pattern designated as reference numeral 38 is formed for the creation of the contact hole to electrically connect the lower impurity doped region, e.g., the source region, with a storage node (not shown) on the cell array region, and to expose the underlying layer on the alignment mark region. After implementing an ion-assisted plasma etch, a contact hole is formed over the cell array region while the second insulation layer 36 and the second oxide layer 37 are removed from the alignment mark region.

According to the method described above with respect to a first preferred embodiment of the present invention, an alignment mark is formed absent an independent conductive pattern, which might generate arcing. As a result of this, the function of the alignment mark can be successfully carried out without any occurrences of arcing.

When a lot ID is used for both the recognition of the wafer and as an alignment mark, a method of the present invention similar to that described above could be applied. This principal will be explained in brief while omitting the repetitive content.

On a lot ID labeled on an appropriate position of the wafer, various materials are formed throughout the manufacturing process for the device. Generally, the lot ID is used as an alignment mark. Otherwise, it just remains as a simple integrated material structure. When the lot ID is used as an alignment mark, the presence of an independent conductive pattern that is not earthen can be a factor causing the generation of arcing during the implementation of the ion-assisted plasma etching. In this case, the problem can be solved by removing the independent conductive pattern during the process of manufacturing the cell array region by applying the same method described for the alignment mark.

When the lot ID is formed only for the designation of the wafer and various materials are simply integrated on the lot ID, the method described for the alignment mark cannot be applied. However, the method described below can be applied to prevent the formation of arcing. Since the method for solving the problem caused by an edge device region can be applied to this case, the explanation for the edge region of the wafer will be explained first.

Figure 8:
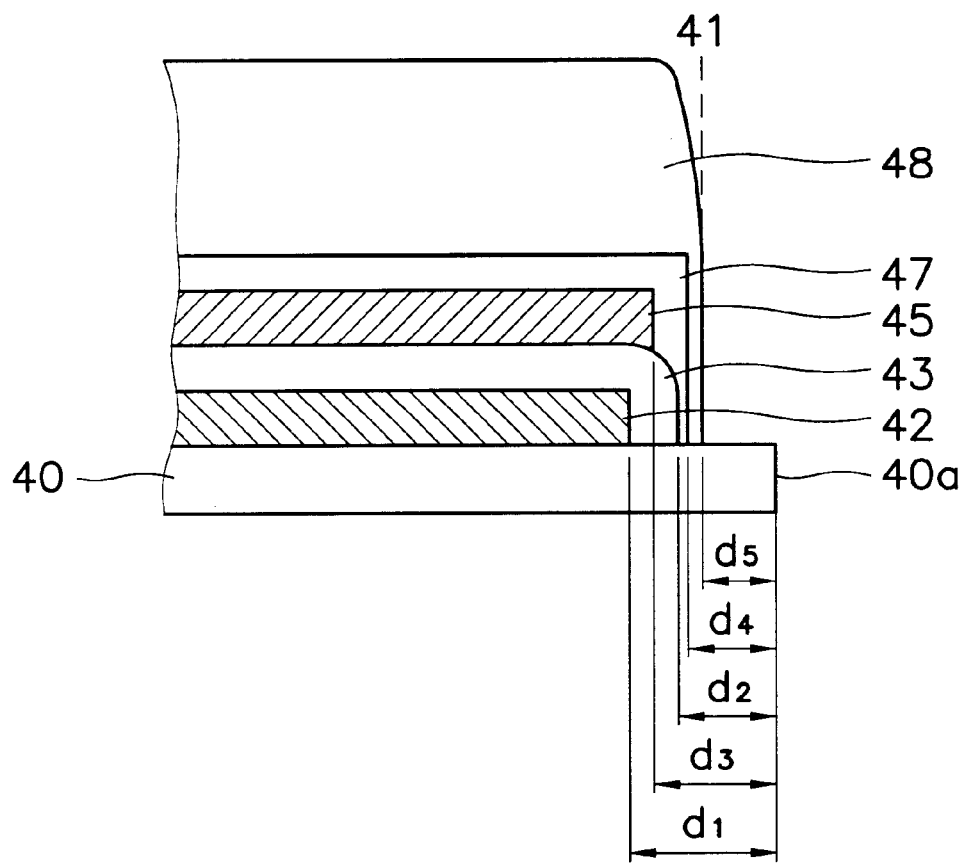
FIG. 8 is a cross-sectional view of an edge device region of a wafer manufactured by a second preferred embodiment of the present invention.

FIG. 8 is a cross-sectional view of an edge device region of a wafer manufactured according to a second preferred embodiment of the present invention.

The unusable edge device, which cannot be used to form a complete device, is mainly used as an alignment mark. At this time, the arcing problem can be overcome by the method described above for the alignment mark. However, the edge portion of the wafer further includes another problem separate from the problems associated with the alignment mark. A method for solving this problem will be explained below.

A gate electrode material layer 42, a first insulation material layer 43, a bit line material layer 45, a second insulation layer 47, and a photoresist pattern 48 are sequentially formed over a silicone substrate 40 in the edge region, as shown in FIG. 8. The structure in FIG. 8 also illustrates the same manufacturing stage shown by FIGS. 1 and 5, except that the field oxide layers are omitted. Accordingly, the next step to be implemented is the ion-assisted plasma etching for the formation of a contact hole as shown in FIGS. 1 and 5.

Figure 5:
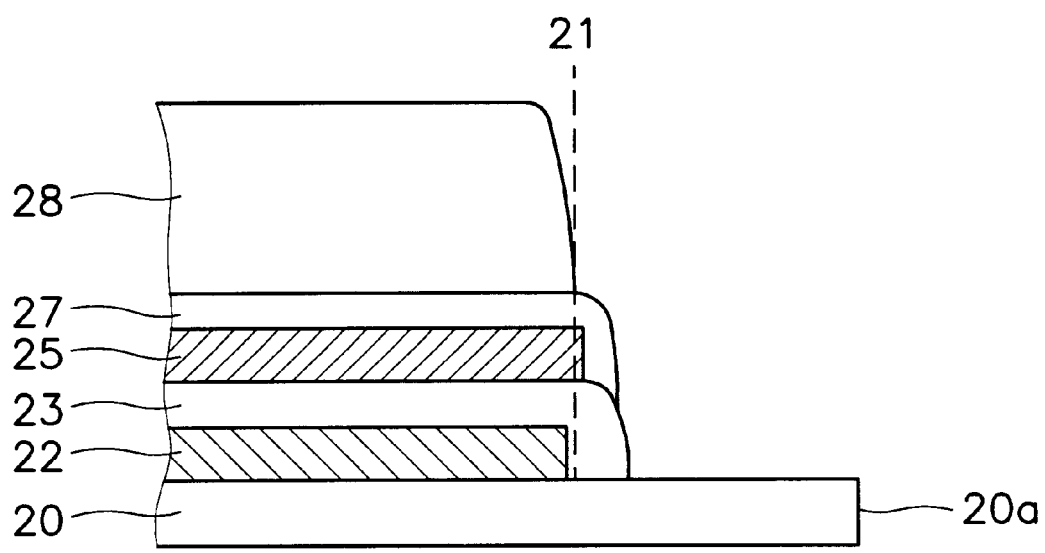
FIG. 5 is a cross-sectional view of an edge device region of a wafer manufactured by a conventional method.

When comparing to FIG. 5, the layers from bottom to a second insulation layer 47 are formed to have a same form. A photoresist pattern 48 is formed apart from the end of the wafer by a predetermined distance through a separate exposure and a side rinse using a thinner. This solves the problem of defect generation by the photoresist layer formed over a side surface 40a of the wafer as described with reference to the conventional design. However, in contrast to the device of FIG. 5, the photoresist pattern 48 in FIG. 8 is formed to sufficiently cover the independent conductive pattern, which is not earthen, such as a gate electrode material layer 42 and/or a bit line material layer 45. As a result of this, the independent pattern is not exposed during the ion-assisted plasma etching, which will be implemented afterward.

For example, the distance from the end of the wafer to each layer are set as shown by FIG. 8. The distance from the end of the wafer to the gate electrode material layer 42 is set as $d_1 = 3.0$ mm; the distance from the end of the wafer to a first insulation layer 43 is set as $d_2 = 2.0$ mm; the distance from the end of the wafer to the bit line material layer 45 is set as $d_3 = 2.5$ mm; the distance from the end of the wafer to the second insulation layer 47 is set as $d_4 = 1.8$ mm; and the distance from the end of the wafer to the photoresist pattern 48 is set as $d_5 = 1.5$–$2.0$ mm.

In other words, the distance from the end of the wafer to each independent conductive pattern is longer than that to the photoresist pattern 48. Accordingly, the etching is implemented along the outermost line of the photoresist pattern 48, i.e., an etching line 41. As a result no independent conductive pattern is exposed to the ion-assisted plasma.

The structure in FIG. 8 is illustrated only as an example, however, and the present invention is not limited by this drawing. The distance from the end of the wafer to the conductive layer is not restricted to any specific value. The effect can be obtained only when the photoresist pattern sufficiently covers the lower conductive layer so that the conductive layer will not be exposed to the ion-assisted plasma.

Conventionally, the generation of the arcing caused by the exposed independent conductive pattern at the edge region was not recognized and hence the photoresist pattern was formed without regard for this point. Sometimes the photoresist pattern was formed so that it covered the lower independent pattern, and sometimes it was formed so that it could not cover the lower independent pattern.

However, according to the method of the present invention, as disclosed in the second preferred embodiment above, the distances from the end of the wafer to the target patterns are correctly calculated and formed based on this calculation. As a result, this eliminates the possibility of generating arcing because of the edge portion.

If the lot ID is formed only for recognizing the wafer, then various materials are simply integrated according to the device manufacturing process as in the edge region. The material layer formed on the lot ID can be removed or left at each step. In the meantime, the lot ID can be recognized even though the materials formed on the lot ID are not removed. Therefore, the materials formed on the lot ID can remain or can be removed as is appropriate for the manufacturing process.

However, the problem of the arcing generation could be solved by covering any material layer formed on the lot ID with a photoresist pattern prior to implementing the ion-assisted plasma etching. Accordingly, it is preferable that an etching mask pattern be formed so that it covers the lot ID region.

According to the preferred embodiments of the present invention, the generation of the arcing by the lot ID can be prevented by removing the independent conductive pattern during the device manufacturing process, or by covering the independent conductive pattern with the photoresist layer before the implementation of ion-assisted plasma etching.

In the preferred embodiments of the present invention, the semiconductor device on the cell array region having a COB (capacitor over bit line) structure is provided as an example to explain the bit line material layer and the gate electrode material layer as the independent patterns that are not earthen. Furthermore, the ion-assisted plasma etching is implemented for the formation of a contact hole to connect the impurity doped region on the substrate with the storage node. However, this method can be applied to any structure of the semiconductor device in order to prevent arcing caused by an independent conductive pattern formed on the non-cell region without departing the spirit of the invention.

For example, the process of forming a pad electrode material layer that is also an independent conductive pattern over the non-cell region, has been omitted for the sake of explanation. However, the same method described above can be applied to this layer to prevent the generation of arcing. Furthermore, in various devices that have a different integration order, an additional material layer, or an omitted layer, the above method can be applied.

As described above, the yield of semiconductor devices can be increased by improving the manufacturing process for the non-cell region, which functions to assist a proper formation of the cell array region. As a result, it should be recognized that the improvements on the manufacturing process for the non-cell region is as important as the process of forming the cell array region.

In the method for manufacturing the semiconductor device according to preferred embodiments of the present invention, the generation of an arcing phenomenon can be prevented by removing the independent conductive pattern, which is a factor of generating arcing during the ion-assisted plasma etching. The generation of an arcing phenomenon can also be prevented by covering the independent conductive pattern before implementing the ion-assisted plasma etching. Accordingly, the yield of the semiconductor device can be markedly increased to improve productivity and the manufacturing cost.

While the present invention is described in detail referring to the above embodiments, various modifications, alternate constructions and equivalents may be employed without departing from the true spirit and scope of the present invention.

What is claimed is:

1. A method for manufacturing a semiconductor device comprising:

forming a conductive layer over a cell array region in which integrated devices are formed and over a non-cell region that functions to assist a proper formation of the cell array region;

forming an etching mask pattern over the conductive layer;

forming a conductive pattern over the cell array region and removing a portion of the conductive layer so as to wholly remove the conductive layer over the non-cell region, by etching the conductive layer using the etching mask pattern as a mask; and implementing an ion-assisted plasma etching to form a pattern over the cell array region.

2. A method for manufacturing a semiconductor device as recited in claim 1, wherein the non-cell region includes one of: an alignment mark used for properly aligning a mask and the cell array region during a photolithographic process, a lot ID for recognition of a wafer, which also functions as the alignment mark, and a region including the alignment mark and the lot ID.

3. A method for manufacturing a semiconductor device as recited in claim 1, wherein the conductive pattern comprises polysilicone, tungsten silicide (WSi), or a composite layer containing both polysilicone and tungsten silicide.

4. A method for manufacturing a semiconductor device as recited in claim 1, wherein the conductive pattern is selected from the group consisting of a bit line, a pad electrode, and a gate electrode.

5. A method for manufacturing a semiconductor device as recited in claim 1, wherein the etching mask pattern is a photoresist pattern.

6. A method for manufacturing a semiconductor device as recited in claim 5, wherein the photoresist pattern is a positive-type photoresist pattern.

7. A method for manufacturing a semiconductor device as recited in claim 1, further comprising exposing a substrate on which a field isolation region is formed, the exposing being implemented by etching an oxide layer and an insulation layer formed over the non-cell region.

8. A method for manufacturing a semiconductor device comprising:

forming a plurality of integrated devices in a cell array region and forming a non-earthen conductive pattern over a non-cell region of a substrate;

forming an etching mask pattern that exposes an exposed region over the cell array region and wholly covers the non-cell region; and implementing an ion-assisted plasma etching to etch the exposed region by the etching mask pattern.

9. A method for manufacturing a semiconductor device as recited in claim 8, wherein the non-cell region includes either an edge device formed on an edge region of a wafer, a lot ID for recognition of each wafer, or a region including the edge device and the lot ID.

10. A method for manufacturing a semiconductor device as recited in claim 8, wherein the conductive pattern comprises polysilicone, tungsten silicide (WSi) or a composite layer containing both polysilicone and tungsten suicide.

11. A method for manufacturing a semiconductor device as recited in claim 8, wherein the conductive pattern is selected from the group consisting of a bit line, a pad electrode, and a gate electrode.

12. A method for manufacturing a semiconductor device as recited in claim 8, wherein the ion-assisted plasma etching is implemented by reactive ion etching (RIE), magnetic enhanced reactive ion etching (MERIE), or thermo coupled plasma etching (TCPE).

13. A method for manufacturing a semiconductor device as recited in claim 8, wherein an output power during implementation of the ion-assisted plasma etching is higher than 500W.

14. A method for manufacturing a semiconductor device as recited in claim 13, wherein the output power during the implementation of the ion-assisted plasma etching is in a range of about 1500–1700W.

15. A method for manufacturing a semiconductor device as recited in claim 8, wherein the ion-assisted plasma etching is implemented for the formation of a contact hole including at least one of a buried contact (BC) hole, a metal contact (MC) hole, and a direct contact (DC) hole.

16. A method for manufacturing a semiconductor device as recited in claim 8, wherein the etching mask pattern is a photoresist pattern.

17. A method for manufacturing a semiconductor device as recited in claim 16, wherein said non-cell region includes an edge device formed on an edge region of a wafer and wherein the photoresist pattern of the edge device is formed by forming a photoresist layer over the substrate and removing the photoresist layer formed over an edge portion, including a side portion of the substrate, by edge exposure and side rinse.

18. A method for manufacturing a semiconductor device as recited in claim 17, wherein a distance from an end of the substrate to the photoresist pattern is shorter than a distance from the end of the substrate to the conductive pattern.

19. A method for manufacturing a semiconductor device comprising:

forming a conductive layer over a cell array region, in which integrated devices are formed, and over a non-cell region, which functions to assist a proper formation of the cell array region;

forming a photoresist pattern over the conductive layer;

etching the conductive layer using the photoresist pattern as a mask to form a conductive pattern over the cell array region and to wholly remove the conductive layer formed over the non-cell region; and implementing an ion-assisted plasma etching, wherein the non-cell region includes an alignment mark for properly aligning a mask and the cell array region during a photolithographic process, or a lot ID for recognition of a wafer that functions as the alignment mark, wherein the conductive pattern is selected from the group consisting of a bit line, a pad electrode, and a gate electrode, and wherein the ion-assisted plasma etching is reactive ion etching (RIE) or magnetic enhanced reactive ion etching (MERIE).

* * * * *